United States Patent
Skogen

(10) Patent No.: US 9,477,040 B1
(45) Date of Patent: Oct. 25, 2016

(54) GUIDED-WAVE PHOTODIODE USING THROUGH-ABSORBER QUANTUM-WELL-INTERMIXING AND METHODS THEREOF

(71) Applicant: Sandia Corporation, Albuquerque, NM (US)

(72) Inventor: Erik J. Skogen, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/801,257

(22) Filed: Jul. 16, 2015

Related U.S. Application Data

(60) Provisional application No. 62/025,656, filed on Jul. 17, 2014.

(51) Int. Cl.
| | |
|---|---|
| H01L 31/0232 | (2014.01) |
| G02B 6/132 | (2006.01) |
| H01L 31/18 | (2006.01) |
| H01L 31/0352 | (2006.01) |
| G02B 6/134 | (2006.01) |
| G02B 6/12 | (2006.01) |

(52) U.S. Cl.
CPC ............. *G02B 6/132* (2013.01); *G02B 6/1347* (2013.01); *H01L 31/02327* (2013.01); *H01L 31/035272* (2013.01); *H01L 31/1844* (2013.01); *G02B 2006/12123* (2013.01); *G02B 2006/12128* (2013.01)

(58) Field of Classification Search
CPC ...................................................... G02B 6/132
USPC ........................................................ 257/432
See application file for complete search history.

(56) References Cited

U.S. PATENT DOCUMENTS

| | | | |
|---|---|---|---|
| 7,564,387 B1 | 7/2009 | Vawter et al. | |
| 7,995,877 B1 | 8/2011 | Skogen et al. | |
| 8,014,639 B1 | 9/2011 | Skogen et al. | |
| 8,363,990 B1 | 1/2013 | Skogen | |
| 8,687,665 B1 | 4/2014 | Tauke-Pedretti et al. | |
| 8,725,004 B1 * | 5/2014 | Vawter ....................... | G02F 7/00 341/137 |
| 8,730,562 B1 | 5/2014 | Tauke-Pedretti et al. | |

OTHER PUBLICATIONS

U.S. Appl. No. 62/049,033, filed Sep. 11, 2014, Skogen et al.
Barton JS et al., "A widely tunable high-speed transmitter using an integrated SGDBR laser-semiconductor optical amplifier and Mach-Zehnder modulator," *IEEE J. Sel. Topics Quantum Electron.* 2003;9(5):1113-7.
Deri RJ et al., "Efficient vertical coupling of photodiodes to InGaAsP rib waveguides," *Appl. Phys. Lett.* Jun. 1991;58(24):2749-51.

(Continued)

*Primary Examiner* — Anthony Ho
(74) *Attorney, Agent, or Firm* — Aman Talwar

(57) ABSTRACT

The present invention includes a high-speed, high-saturation power detector (e.g., a photodiode) compatible with a relatively simple monolithic integration process. In particular embodiments, the photodiode includes an intrinsic bulk absorption region, which is grown above a main waveguide core including a number of quantum wells (QWs) that are used as the active region of a phase modulator. The invention also includes methods of fabricating integrated photodiode and waveguide assemblies using a monolithic, simplified process.

22 Claims, 5 Drawing Sheets

(56) References Cited

OTHER PUBLICATIONS

Heck MJR et al., "Hybrid silicon photonics for optical interconnects," *IEEE J. Sel. Topics Quantum Electron.* Mar./Apr. 2011;17(2):333-46.
Ishibashi T et al., "InP/InGaAs uni-traveling-carrier photodiodes," *IEICE Trans. Electron.* Jun. 2000;E83-C(6):938-49.
Lal V et al., "Quantum-well-intermixed monolithically integrated widely tunable all-optical wavelength converter operating at 10 Gb/s," *IEEE Photonics Technol. Lett.* 2005;17(8):1689-91.
Li N et al., "High-saturation-current charge-compensated InGaAs—InP uni-traveling-carrier photodiode," *IEEE Photonics Technol. Lett.* Mar. 2004;16(3):864-6.
Liu N et al., "Enhanced photoluminescence emission from bandgap shifted InGaAs/InGaAsP/InP microstructures processed with UV laser quantum well intermixing," *J. Phys. D: Appl. Phys.* 2013;46:445103 (7 pp.).
Marsh JH, "Quantum well intermixing," *Semicond. Sci. Technol.* 1993;8:1136-55.
Masanovic ML et al., "Cross-phase modulation efficiency in offset quantum-well and centered quantum-well semiconductor optical amplifiers," *IEEE Photonics Technol. Lett.* 2005;17(11):2364-6.
Morrison GB et al., "Electroabsorption modulator performance predicted from band-edge absorption spectra of bulk, quantum-well, and quantum-well-intermixed InGaAsP structures," *Solid-State Electron.* 2007;51(1):38-47.
Morrison GB et al., "Photocurrent spectroscopy analysis of widely tunable negative-chirp quantum-well intermixed laser-modulator transmitters," *Appl. Phys. Lett.* 2005;86:071118 (3 pp.).
Morrison GB et al., "Photocurrent spectroscopy for quantum-well intermixed photonic integrated circuit design," *IEEE Photonics Technol. Lett.* 2005;17(7):1414-6.
Raring JW et al., "40 Gbit/s photonic receivers integrating UTC photodiodes with high- and low-confinement SOAs using quantum well intermixing and MOCVD regrowth," *Electron. Lett.* 2006;42(16):942-3.
Raring JW et al., "A study of regrowth interface and material quality for a novel InP-based architecture," *J. Cryst. Growth* 2004;273(1-2):26-37.
Raring JW et al., "Demonstration of high saturation power/high gain SOAs using quantum well intermixing based integration platform," *Electron. Lett.* 2005;41(24):1345-6.
Raring JW et al., "Demonstration of negative chirp characteristics over wide wavelength range using monolithically integrated SG-DBR laser/electroabsorption modulator," *Electron. Lett.* 2004;40(25):1599-1600.
Raring JW et al., "Demonstration of widely tunable single-chip 10-Gb/s laser-modulators using multiple-bandgap InGaAsP quantum-well intermixing," *IEEE Photonics Technol. Lett.* 2004;16(7):1613-5.
Raring JW et al., "Design and demonstration of novel QW intermixing scheme for the integration of UTC-type photodiodes with QW-based components," *IEEE J. Quantum Electron.* Feb. 2006;42(2):171-81.
Raring JW et al., "Enhanced frequency response in buried ridge quantum well intermixed SGDBR laser modulators," *Conference on Lasers and Electro-Optics*, held on May 16-21, 2004 at San Francisco, CA (pp. 1243-1244).
Raring JW et al., "Low dispersion penalty at 10 Gb/s, over 75 km, using a quantum-well-intermixed electroabsorption-modulator/widely-tunable laser transmitter," *Optical Fiber Communication Conference*, held on Feb. 23-27, 2004 at Los Angeles, CA (3 pp.).
Raring JW et al., "Quantum well intermixing and MOCVD regrowth for the monolithic integration of 40 Gbit/s UTC type photodiodes with QW based components," *Electron. Lett.* Sep. 2005;41(18): 1033-4.
Skogen E et al., "Integration of high-gain and high-saturation-power active regions using quantum-well intermixing and offset-quantum-well regrowth," *Electron. Lett.* 2004;40(16):993-4.
Skogen EJ et al., "A quantum-well-intermixing process for wavelength-agile photonic integrated circuits," *IEEE J. Sel. Topics Quantum Electron.* Jul./Aug. 2002;8(4):863-9.
Skogen EJ et al., "High contrast InP/InGaAsP grating MOCVD regrowth using TBA and TBP," *J. Cryst. Growth* 2004;272(1-4):564-9.
Skogen EJ et al., "Integrated guided-wave photodiode using through-absorber quantum-well-intermixing," *IEEE Photonics Technol. Lett.* Sep. 2013;25(17):1684-6.
Skogen EJ et al., "Monolithically integrated active components: A quantum-well intermixing approach," *IEEE J. Sel. Topics Quantum Electron.* Mar./Apr. 2005;11(2):343-55.
Skogen EJ et al., "Multiple-band-edge quantum-well intermixing in the InGaAs/InGaAsP/InGaP material system," *Appl. Phys. Lett.* 2005;86:241117 (3 pp.).
Skogen EJ et al., "Optical AND and NOT gates at 40 Gbps using electro-absorption modulator/photodiode pairs," *Proc. 23rd Annual Meeting of the IEEE Photonics Soc.*, held on Nov. 7-11, 2010 in Denver, Colorado, pp. 52-53.
Skogen EJ et al., "Postgrowth control of the quantum-well band edge for the monolithic integration of widely tunable lasers and electroabsorption modulators," *IEEE J. Sel. Topics Quantum Electron.* Sep./Oct. 2003;9(5):1183-90.
Skogen EJ et al., "Tunable buried ridge stripe sampled grating distributed Bragg reflector lasers utilizing quantum well intermixing," *14th Annual Meeting of the IEEE Lasers and Electro-Optics Society*, held in San Diego, CA on Nov. 12-13, 2001 (pp. 169-170).
Skogen EJ et al., "Tunable sampled-grating DBR lasers using quantum-well intermixing," *IEEE Photonics Technol. Lett.* 2002;14(9):1243-5.
Skogen EJ, "Quantum well intermixing for wavelength-agile photonic integrated circuits," *Ph.D. dissertation thesis for University of California Santa Barbara, Department of Electrical and Computer Engineering*, Jun. 2003 (185 pp.).
Sonkar RK et al., "Quantum well intermixed waveguide grating," *Opt. Quantum Electron.* 2011;42:631-43.
Sysak MN et al., "Integration of hybrid silicon lasers and electroabsorption modulators," *Opt. Express* Aug. 2008;16(17):12478-86.
Tauke-Pedretti A et al., "Mutual injection locking of monolithically integrated coupled-cavity DBR lasers," *IEEE Photonics Technol. Lett.* Jul. 2011;23(13):908-10.
Wang CS et al, "Fabrication and molecular beam epitaxy regrowth of first-order, high contrast AlGaAs/GaAs gratings," *J. Vac. Sci. Technol. B* 2006;24(3):1559-63.
Younis U et al., "Towards monolithic integration of nonlinear optical frequency conversion," *IEEE Photonics Technol. Lett.* Sep. 2010;22(18):1358-60.

\* cited by examiner

US 9,477,040 B1

GUIDED-WAVE PHOTODIODE USING THROUGH-ABSORBER QUANTUM-WELL-INTERMIXING AND METHODS THEREOF

CROSS-REFERENCE TO RELATED APPLICATION

This application claims the benefit of U.S. Provisional Application No. 62/025,656, filed Jul. 17, 2014, which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to integrated optoelectronic (e.g., photodiode) structures and methods for making and using such structures.

BACKGROUND OF THE INVENTION

Monolithic integration of optoelectronic components can provide numerous benefits, including reductions in size, cost, weight, and power dissipation, as well as new functionality that cannot be emulated by discrete components. For instance, when discrete components are used, these components must be coupled (e.g., using an optical fiber or optical splice). Such coupling techniques can result in optical loss, costly packaging required for each component, and decreased reliability due to mechanical interconnection issues. Thus, additional methods to simplify monolithic integration are desired.

To maximize versatility, such methods should allow a circuit designer to include any number of useful components on a single photonic integrated circuit (PIC). Exemplary optoelectronic components semiconductor lasers, amplifiers, attenuators, photodiodes, electroabsorption modulators, active ring-resonators, and various low-loss waveguide components. For instance, quantum-well-intermixing (QWI) is a powerful technique for selectively modifying the spatial profile of a quantum well. Further methods are desired, which can be used in combination with QWI to provide any number of components side-by-side on a single PIC, without degrading or compromising performance of such component(s).

SUMMARY OF THE INVENTION

Accordingly, the present invention includes a high-speed, high-saturation power detector (e.g., a photodiode) compatible with a relatively simple monolithic integration process. The photodiode includes an intrinsic bulk absorption region, which is grown above a main waveguide core including a number of quantum wells (QWs) that are used as the active region of a phase modulator. Through-absorber quantum-well-intermixing is used to blue-shift the bandedge of the underlying quantum wells, reducing the optical losses of that material. In addition, the detector and modulator can include any other useful structures, e.g., an electron drift region, bandgap grade layer(s), field termination layer(s), cladding layer(s), contact layer(s), confinement layer(s), etc., such as any described herein. In one embodiment, the detector demonstrated >90% quantum efficiency, >16 dBm input saturation power, and 3-dB bandwidth of 50 GHz.

In particular embodiments, the photodiode design not only enables desired characteristics but eliminates the need for a photodiode-specific epitaxial regrowth step. For example, in the process herein, the photodiode structure is included in the first epitaxial growth along with the required main waveguide core below. Using this process, we were able to blue-shift the bandedge of the QWs residing within the waveguide core by diffusing point defects through the detector structure, thereby maintaining the ability to tailor the bandedge of the MQW with the detector layers already in place. This simplifies the process by eliminating the photodiode specific regrowth step.

Accordingly, the present invention features a method of fabricating an integrated structure, the method including: i) providing a base structure including a multiple-quantum-well (MQW) region and a detector region (e.g., photodiode region); ii) introducing impurities, creating vacancies, or heating through the detector region and into the MQW region, thereby producing an intermixed MQW region; and iii) depositing one or more cladding layers on the detector or detector region (e.g., photodiode or photodiode region).

In some embodiments, the base structure includes the MQW region underlying the photodiode region. In other embodiments, the MQW region is disposed between two confinement layers. In some embodiments, the photodiode region includes an absorption region, an electron drift region, and/or a sub-collector region. In yet other embodiments, the base structure further includes an implant layer disposed above the photodiode region.

In other embodiments, the base structure further includes a waveguide region disposed beneath the photodiode region, where the waveguide region includes the MQW region. In some embodiments, the base structure further includes a field termination layer disposed between the photodiode region and the waveguide region. In other embodiments, the base structure further includes an n-type cladding layer and/or an n-type contact layer disposed beneath the MQW region.

In some embodiments, the method includes, prior to step ii), patterning a top surface of the base structure with a mask to define an active region and a passive region. In other embodiments, the method further includes removing the mask.

In some embodiments, step ii) includes implanting an ion (e.g., any herein, such as $P^+$) into the base structure (e.g., thereby creating an implanted structure). In other embodiments, step ii) further includes annealing the implanted structure (e.g., thereby diffusing one or more vacancies through the photodiode region and into the MQW region and producing the intermixed MQW region).

In some embodiments, the method further includes, prior to step iii), patterning a top surface of the base structure with a photodiode mask to define at least one dimension of a photodiode, where the photodiode includes a portion of the photodiode region. In other embodiments, the method includes removing a portion of the base structure (e.g., a portion of the photodiode region), thereby releasing the photodiode from the base structure.

In some embodiments, the method further includes, after step iii), depositing one or more contact layers (e.g., n- or p-type contact layers) on at least a portion of the one or more cladding layers.

In another aspect, the invention features a method of fabricating an integrated structure (e.g., any herein), the method including: i) providing a base structure including a MQW region and a photodiode region; ii) patterning a top surface of the base structure with a hard mask to define an active region and a passive region; iii) introducing impurities, creating vacancies, or heating through the photodiode region and into the MQW region, thereby producing an intermixed MQW region within the active region; iv) removing the hard mask, thereby exposing a top surface of the base structure having the intermixed MQW region; v) patterning a top surface of the base structure with a photodiode mask to define a photodiode, where the photodiode includes a portion of the photodiode region; and vi) removing a portion of the base structure, thereby releasing the photodiode from the base structure.

In further embodiments, the method includes vii) depositing one or more cladding layers on the photodiode region, thereby providing a cladded base structure.

In other embodiments, the method includes viii) depositing and/or patterning one or more contact layers on a top surface or a bottom surface of the cladded base structure.

In some embodiments, step iii) includes implanting an ion (e.g., any described herein, such as $P^+$) into the base structure, thereby creating an implanted structure, and/or annealing the implanted structure, thereby diffusing one or more vacancies through the photodiode region and into the MQW region and producing the intermixed MQW region.

In yet another aspect, the invention features an assembly (e.g., an integrated assembly) fabricated by any method described herein. In some embodiment, the assembly includes a monolithically integrated photodiode and waveguide.

In any embodiment herein, the base structure includes a waveguide region including a MQW region, a first confinement layer disposed above the MQW region, and a second confinement layer disposed below the MQW region; a photodiode region disposed above the waveguide region; a field termination layer disposed between the photodiode region and the waveguide region; and an implant layer disposed above the photodiode region. In other embodiments, the base structure further includes an n-type cladding layer and/or an n-type contact layer disposed beneath the waveguide region.

In any embodiment herein, the base structure further includes one or more bandgap grade layers between two layers having a heterointerface or a different bandgap separation.

DEFINITIONS

As used herein, the term "about" means +/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

Figure 1A:
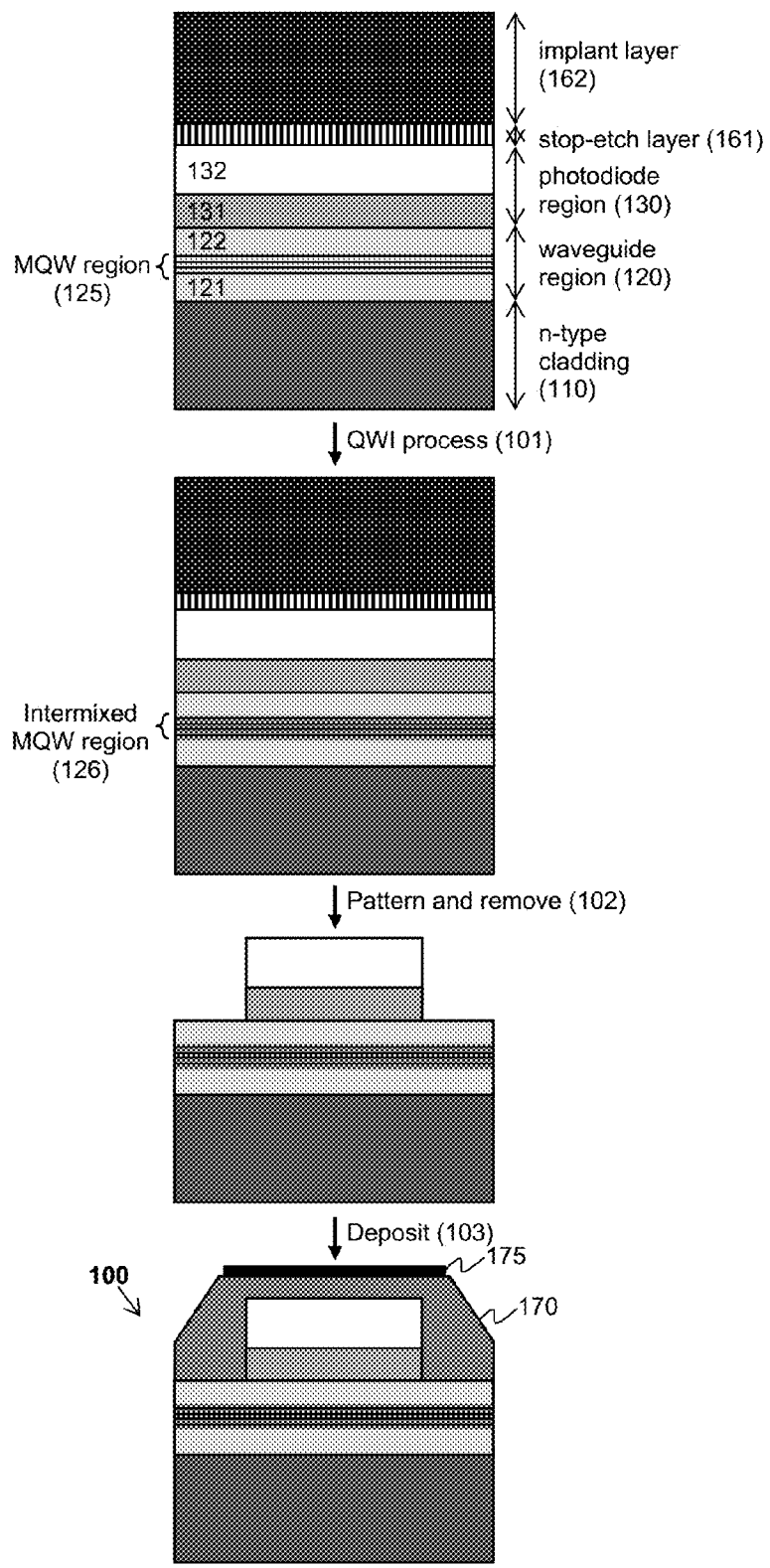
FIG. 1A-1B shows schematics of exemplary methods for making non-limiting integrated structures 100, 1000.

The present invention relates to an integrated structure having a multiple-quantum-well (MQW) region, as well as methods of fabricating such structures. In particular, the structures and methods herein allow for simplified integration of structures to form a monolithic optoelectronic assembly (e.g., for use in photonic integrated circuits).

The integrated structures of the present invention include quantum wells, which provide potential wells with discrete energy values. Multiple-quantum-well structures (MQWs), i.e., those having a plurality of quantum wells, can be employed in any useful optoelectronic component, such as semiconductor lasers, modulators, resonators, photodiodes, etc. MQW regions generally include one or more quantum wells, where each well is located between two barrier regions. In general, a plurality of alternating thin layers of lower and higher bandgap materials is used to support quantum wells and barriers. Additional details follow.

Methods of Fabrication

Quantum wells and MQWs can be fabricated in any useful manner. In general, a quantum well is a heterostructure formed with a layer of a first semiconductor material having a lower bandgap (e.g., GaAs), which is then sandwiched between two barrier regions or barrier layers of a second semiconductor material having a wider or higher bandgap (e.g., AlGaAs). Materials for quantum wells and barriers (e.g., any described herein), as well as thin films thereof, can be deposited in any useful manner, including chemical vapor diffusion (CVD), such as metal-organic CVD (MOCVD), metal-organic vapor phase epitaxy (MOVPE), and molecular beam epitaxy (MBE).

Any useful process can be employed to form MQWs. In one example, the process employs quantum-well-intermixing (QWI). QWI involves any number of processes that either introduces impurities or creates vacancies into an as-grown heterointerface or heterostructure (e.g., in an as-grown MQW region). Heterointerfaces are generally metastable, as materials at these interfaces tend to interdiffuse. Impurities and vacancies accelerate this interdiffusion process. Exemplary QWI processes include impurity-induced disordering (IID), which employs a dopant as an impurity to promote intermixing; impurity-free vacancy-enhanced disordering (IFVD), which is implemented by coating a structure with a dielectric film, e.g., $SiO_2$, and annealing the structure to create point defects; photoabsorption-induced disordering (PAID), which uses localized heating by lasers to promote intermixing; and implantation-enhanced interdiffusion, which is implemented by implanting an ion into a structure and annealing the implanted structure to create point defects. Additional details of QWI processes are described in Marsh J H, "Quantum well intermixing," *Semicond. Sci. Technol.* 1993; 8:1136-55; Skogen E J et al., "Monolithically integrated active components: A quantum-well intermixing approach," *IEEE J. Sel. Topics Quantum Electron.* 2005 March/April; 11(2):343-55; Liu N et al., "Enhanced photoluminescence emission from bandgap shifted InGaAs/InGaAsP/InP microstructures processed with UV laser quantum well intermixing," *J. Phys. D: Appl. Phys.* 2013; 46:445103 (7 pp.); Sonkar R K et al., "Quantum well intermixed waveguide grating," *Opt. Quantum Electron.* 2011; 42:631-43; and Skogen E J, "Quantum well intermixing for wavelength-agile photonic integrated circuits," *Ph.D. dissertation thesis for University of California Santa Barbara, Department of Electrical and Computer Engineering*, June 2003 (185 pp.), each of which is incorporated herein by reference in its entirety.

In one embodiment, QWI requires two steps: a growth step to provide a MQW region including alternating materials for the quantum well(s) and barrier(s); and an intermixing step to diffuse point defects throughout the MQW region, which promotes interdiffusion of atoms between the well and barrier regions. Interdiffusion, in turn, changes the quantum well profile, such that the intermixed MQW region generally has increased energy (e.g., a blue-shifted bandgap), as compared to the as-grown MQW region. In one particular embodiment, the intermixing step includes implanting an ion (e.g., any herein) to provide an implanted structure and annealing the implanted structure.

These QWI processes can be used to fabricate an integrated structure. FIG. 1A provides an exemplary method for fabricating an integrated photodiode-waveguide structure 100. First, a base structure can be provided, where the base structure includes an implant layer 162, one or more stop-etch layers 161, a photodiode region 130, a waveguide region 120, and an n-type cladding or a substrate 110 (e.g., such as those including InP, InP:Fe, or InP:Si, as well as n-type substrates).

The photodiode region 130 includes an absorption region 132 and an electron drift region (or collector region) 131. Exemplary materials include those for the absorption region (e.g., those including neutral or intrinsic InGaAs, InGaAs:Zn, InAlAs, or p-type InGaAs) or the electron drift region (e.g., those including 1.0Q material, InP, InGaAsP, or InGaAs including undoped or doped (e.g., n-doped) forms thereof).

The waveguide region 120 generally includes a core disposed between two confinement regions 121, 122. In particular embodiments, the core includes a MQW region 125. In some embodiments, the MQW region includes n quantum wells separated by n-1 or n+1 barriers, where n is an integer of from 1 to 20 (e.g., from 4 to 20). In other embodiments, the wells and barriers are formed from InGaAsP or InAlGaAs. Exemplary materials for the confinement regions include InGaAsP:Si (1.3Q:Si). In yet other embodiments, to maximize optical mode overlap, the MQW region is located in the center of the waveguide region.

As shown in FIG. 1A, the QWI process 101 can be performed through the photodiode region 130 and into the waveguide region 120 having the MQW region 125 to provide an intermixed MQW region 126. Using this process, the bandedge of the QWs residing within the waveguide core can be blue-shifted by diffusing point defects through the detector/photodiode structure, thereby maintaining the ability to tailor the bandedge of the MQW with the detector layers already in place. This simplifies the process by eliminating the photodiode specific regrowth step.

In particular, the implant layer 162 facilitates the QWI process by capturing the vacancies created by ion implantation. Removal of the implant layer halts diffusion of the vacancies and, therefore, allows for spatial control of forming intermixed MQW regions. In some embodiments, the QWI process includes introducing impurities or creating vacancies through the photodiode region and into the MQW region (e.g., by implanting an ion through the implant layer), followed by annealing the resultant structure.

After the QWI process, the implant layer and the stop-etch layer(s) can be etched (e.g., by employing any useful wet chemical etching process). Additional details on the QWI process are provided in Skogen E J, "Quantum well intermixing for wavelength-agile photonic integrated circuits," *Ph.D. dissertation thesis for University of California Santa Barbara, Department of Electrical and Computer Engineering*, June 2003 (185 pp.), which is incorporated herein by reference in its entirety.

Then, one or more photolithography steps, such as patterning and removing or etching steps 102, can be performed to release the photodiode. Any useful layer can be present between the photodiode and the waveguide region, such as a field termination layer (e.g., any described herein).

Finally, one or more materials can be deposited 103 to form the integrated structure 100. Exemplary materials include those for a cladding region 170 (e.g., a p-type cladding material, such as those including InP, InP:Zn, or InGaAsP; or an n-type cladding material, such as those including InP:Si) or a contact layer 175 (e.g., a p-type contact layer, such as those including InGaAs, InGaAsP, InGaAsP:Zn, or InGaAs:Zn; or an n-type contact layer, such as those including InP:Si). The structure can include any number of optional materials, such as one or more capping layers (e.g., a p-type InGaAsP) and/or anti-reflective coatings (e.g., $SiO_2$).

Figure 1B:
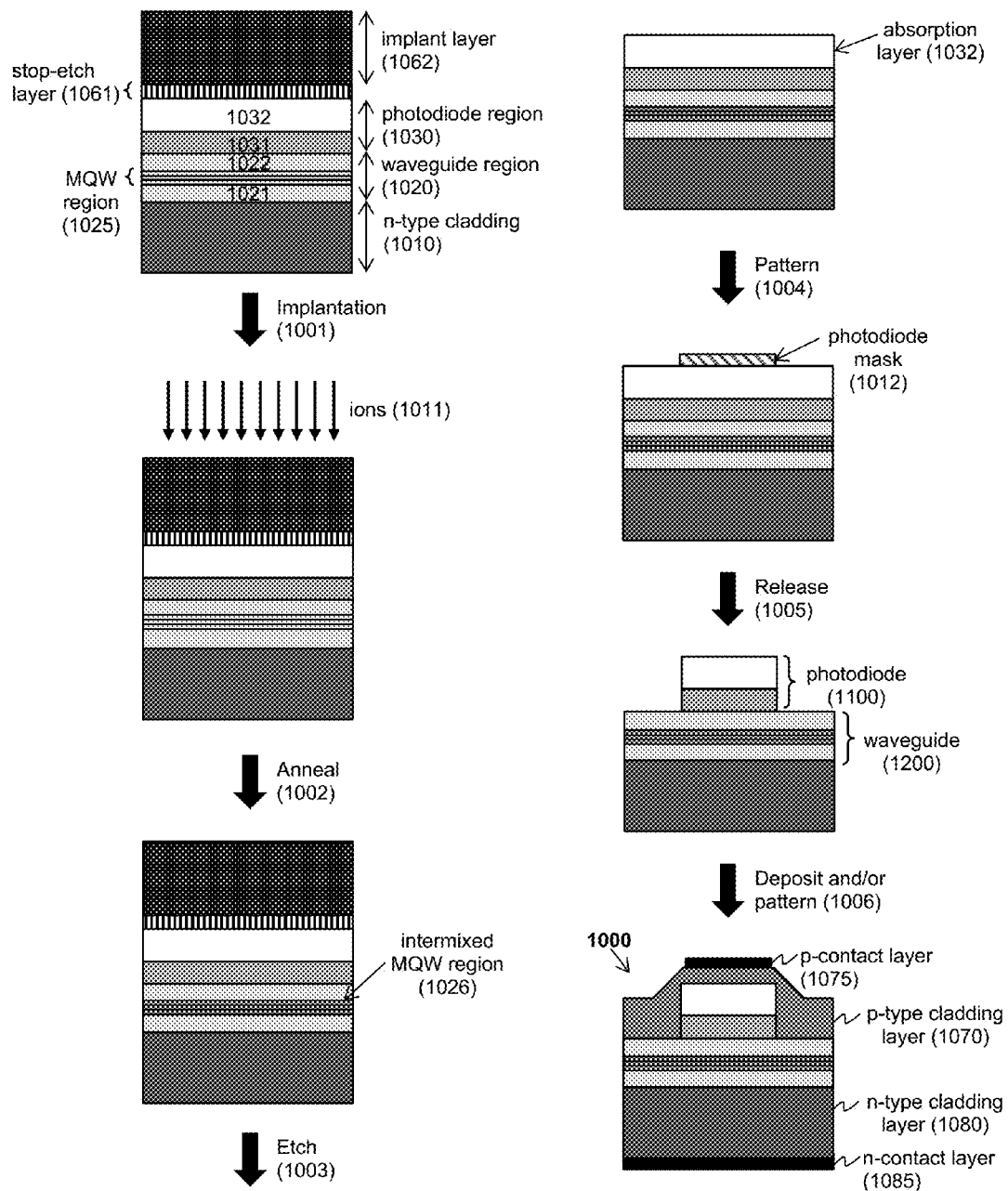

FIG. 1B provides another exemplary method for fabricating an integrated photodiode-waveguide structure 1000. The method includes use of a base structure including an implant layer 1062, one or more stop-etch layers 1061, a photodiode region 1030 including an adsorption region 1032 and an electron drift region 1031, a waveguide region 1020 including a MQW region 1025 disposed between two confinement regions 1021, 1022, and an n-type cladding region 1010.

The implantation step 1001 includes exposing the structure to one or more ions 1011. Any useful ion can be implanted in the structure, including phosphorous, boron, fluorine, silicon, sulfur, zinc, or gallium, under any useful condition (e.g., an energy of about 100 to about 400 keV and an implantation temperature of about 200° C.).

The annealing step 1002 includes heating the structure to promote ion diffusion into the MQW region, thereby forming an intermixed MQW region 1026. Annealing can include rapid thermal annealing (RTA) at any useful temperature (e.g., of about 600° C. to about 700° C.) and any useful annealing time (e.g., of from about 30 second to about 5 minutes). One or more annealing steps can be conducted to obtain the desired optical properties.

The etching step 1003 includes a process (e.g., a wet chemical process) to remove the implant layer 1062 and stop-etch layer 1061, thereby exposing a surface of the absorption layer 1032. Next, the patterning step 1004 includes depositing one or more photodiode masks 1012 to define one or more dimensions of the photodiode to be integrated into the structure. Then, a release step 1005 removes a portion of the base structure and provides the photodiode 1100 and waveguide 1200 disposed on the substrate or n-cladding layer. Finally, one or more depositing and/or patterning steps 1006 can include depositing one or more p-contact layers 1075, p-type cladding layers 1070, n-type cladding layers 1080, and/or n-type contact layers 1085 to provide the integrated structure 1000. In particular embodiments, the n-type contact layer can be included on a bottom surface of the base structure or, alternatively, disposed on the top surface of the base structure by including one or more vias.

Either the intermixed MQW region or the as-grown MQW region may underlie the photodiode region. For instance, in some embodiments, the intermixed MQW region can be beneficial because, e.g., the blue-shifted state can provides the proper peak photoluminescence wavelength and/or beneficial optical transparency. In some embodiments, the MQW region can be epitaxially grown under conditions to optimize performance (e.g., phase modulation or gain). In other embodiments, the active region encompasses the intermixed MQW region, and the process can be configured to provide the photodiode region overlying the intermixed MQW region. FIG. 1B provides an exemplary process in which the active region includes an intermixed MQW region.

The waveguide region can include intermixed MQW region(s) and/or as-grown MQW region(s). For instance, for a passive waveguide, the waveguide region can include intermixed MQW region(s), and the process can be configured to provide a released waveguide encompassing an intermixed MQW region in its core. Alternatively, the waveguide can include periodic regions of intermixed MQW region interspersed with as-grown MQW regions, such as that described in Younis U et al., "Towards monolithic integration of nonlinear optical frequency conversion," *IEEE Photonics Technol. Lett.* 2010 September; 22(18): 1358-60, which is incorporated herein by reference in its entirety.

Additional steps can be conducted to complete the device. Exemplary steps include those to deposit n-contact(s) and/or p-contact(s), such as by a lift-off process; deposit passivation layer(s); deposit proton implant layer(s) to minimize leakage; provide vias to access particular layers within the structure; solder wires and/or other electrical connectors; cut or separate dies; polish or lap devices; provide on a carrier substrate; deposit anti-reflection layer(s); and/or package the device, as well as any described in U.S. Pat. Nos. 7,564,387, 8,014,639, 8,363,990, and 8,687,665; Sysak M N et al., "Integration of hybrid silicon lasers and electroabsorption modulators," *Opt. Express* 2008 August; 16(17):12478-86; Heck M J R et al., "Hybrid silicon photonics for optical interconnects," *IEEE J. Sel. Topics Quantum Electron.* 2011 March/April; 17(2):333-46; Raring J W et al., "Quantum well intermixing and MOCVD regrowth for the monolithic integration of 40 Gbit/s UTC type photodiodes with QW based components," *Electron. Lett.* 2005 September; 41(18): 1033-4; Raring J W et al., "Design and demonstration of novel QW intermixing scheme for the integration of UTC-type photodiodes with QW-based components," *IEEE J. Quantum Electron.* 2006 February; 42(2):171-81; Skogen E J et al., "A quantum-well-intermixing process for wavelength-agile photonic integrated circuits," *IEEE J. Sel. Topics Quantum Electron.* 2002 July/August; 8(4):863-9; Skogen E J et al., "Postgrowth control of the quantum-well band edge for the monolithic integration of widely tunable lasers and electroabsorption modulators," *IEEE J. Sel. Topics Quantum Electron.* 2003 September/October; 9(5):1183-90; and Tauke-Pedretti A et al., "Mutual injection locking of monolithically integrated coupled-cavity DBR lasers," *IEEE Photonics Technol. Lett.* 2011 July; 23(13):908-10, each of which is incorporated herein by reference in its entirety.

Integrated Structures

The integrated structure can have any useful components, regions, and layers. For instance, starting from the bottom surface of a structure, the integrated structure can include a support substrate (e.g., formed from intrinsic materials or n-type or n-doped materials). If the support substrate is formed from an insulating material (e.g., InP:Fe or GaAs), then an n-type cladding layer can be included between the support substrate and the active components of the structure (e.g., the base structure including the waveguide and photodiode regions).

The active components of the structure generally include a waveguide region and a photodiode region. In some embodiments, these regions are vertically coupled, where the photodiode region is grown above the waveguide region.

The waveguide region can be a homostructure (e.g., composed of a single structure capable of transmitting an optical signal) or a heterostructure (e.g., composed of two or more structures, which generally include an optically transmitting core surrounded by a confinement region). In some embodiments, the waveguide region is a heterostructure, where a MQW region resides within the core. In other embodiments, heterostructure includes a confinement region (e.g., formed from any useful material, such as any herein) disposed beneath and/or above the core.

The photodiode region typically includes an absorption region configured to absorb light. In one embodiment, the photodiode region includes a PIN junction (e.g., an intrinsic semiconductor material (e.g., an intrinsic InGaAs (i-InGaAs) absorption region) disposed between a p-type material and an n-type material (e.g., a p-type and n-type contact layers)). In another embodiment, the photodiode region includes a uni-traveling carrier (UTC) junction having an absorption region (e.g., composed of a p-type material, such as p-InGaAs) and an electron drift region (e.g., composed of a widegap material, such as i-InP). In yet another embodiment, the photodiode region includes a partially depleted absorber (PDA) junction having an absorption region (e.g., composed of a p-type material, such as p-InGaAs), an electron drift region (e.g., composed of a widegap material, such as i-InP or i-InGaAs), and an n-type material (e.g., any herein).

Exemplary photodiodes and photodiode regions are described in U.S. Pat. No. 7,564,387; Ishibashi T et al., "InP/InGaAs uni-traveling-carrier photodiodes," *IEICE Trans. Electron.* 2000 June; E83-C(6):938-49; Deri R J et al., "Efficient vertical coupling of photodiodes to InGaAsP rib waveguides," *Appl. Phys. Lett.* 1991 June; 58(24):2749-51; Li N et al., "High-saturation-current charge-compensated InGaAs—InP uni-traveling-carrier photodiode," *IEEE Photonics Technol. Lett.* 2004 March; 16(3):864-6; Raring J W et al., "Quantum well intermixing and MOCVD regrowth for the monolithic integration of 40 Gbit/s UTC type photodiodes with QW based components," *Electron. Lett.* 2005

September; 41(18): 1033-4; Raring J W et al., "Design and demonstration of novel QW intermixing scheme for the integration of UTC-type photodiodes with QW-based components," *IEEE J. Quantum Electron.* 2006 February; 42(2): 171-81; and Skogen E J et al., "Monolithically integrated active components: A quantum-well intermixing approach," *IEEE J. Sel. Topics Quantum Electron.* 2005 March/April; 11(2):343-55, each of which is incorporated herein by reference in its entirety.

The photodiode region can include any other useful structures, including one or more capping layers (e.g., including p-type materials, such as intrinsic p-type materials or p-doped materials, including p-InGaAsP, which can disposed between the p-contact layer and the absorption region), diffusion barriers, and/or sub-collector regions (e.g., including InP:Si or n-doped InP, which can be disposed between the electron drift region and the waveguide region).

In addition, one or more bandgap grade layers can be present between any heterointerface regions having different bandgaps. Such grade layers can include any useful material (e.g., an impedance matching material), including InGaAsP, InGaAs, InP:Si, InGaAs:Zn, or InP, as well as doped forms (e.g., n-doped forms) thereof.

Cladding material can be deposited to electrically and/or optically isolate the different components in the integrated structure. Exemplary cladding materials include an insulator, as well as any described herein. Optionally, one or more waveguide rib structures can be included on a top surface of the base structure.

Figure 2:
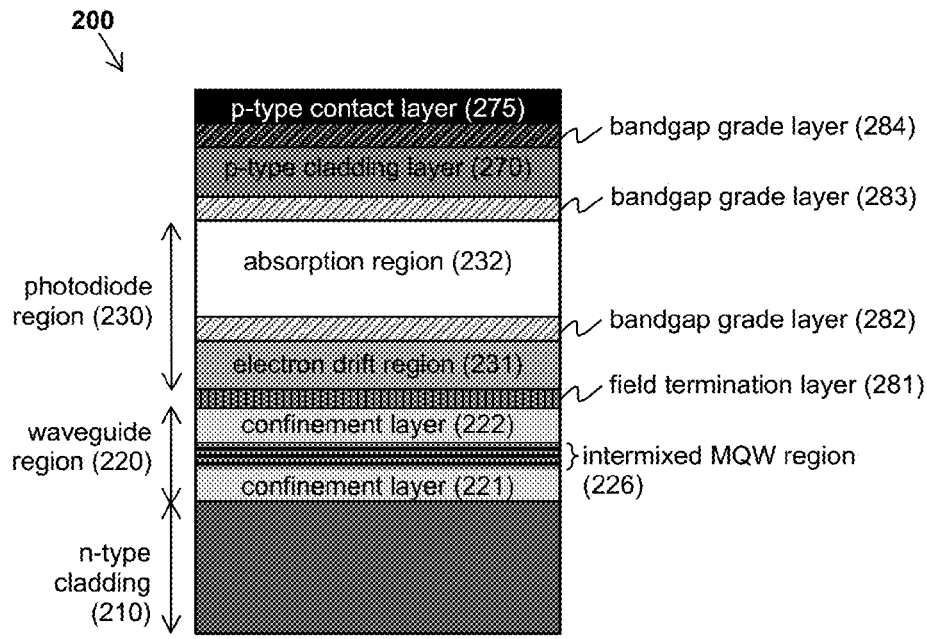
FIG. 2 is a schematic of an exemplary integrated structure 200.

In one non-limiting example (FIG. 2), the integrated structure 200 includes a p-type contact layer 275; a bandgap grade layer 284; a p-type cladding layer 270; a bandgap grade layer 283; a photodiode region 230 including an absorption region 232, a bandgap grade layer 282, and an electron drift region 231; a field termination layer 281; a waveguide region 220 including an intermixed MQW region 226 disposed between two confinement layers 221, 222; and an n-type cladding layer 210. In some embodiments, each of the bandgap grade layers can include one or more layers of materials configured to gradually change the bandgap energy or wavelength between the heterointerface present between two different layers (e.g., between the p-contact and cladding layers, between the p-cladding layer and the absorption region, and/or between the absorption region and the electron drift region).

Figure 3:
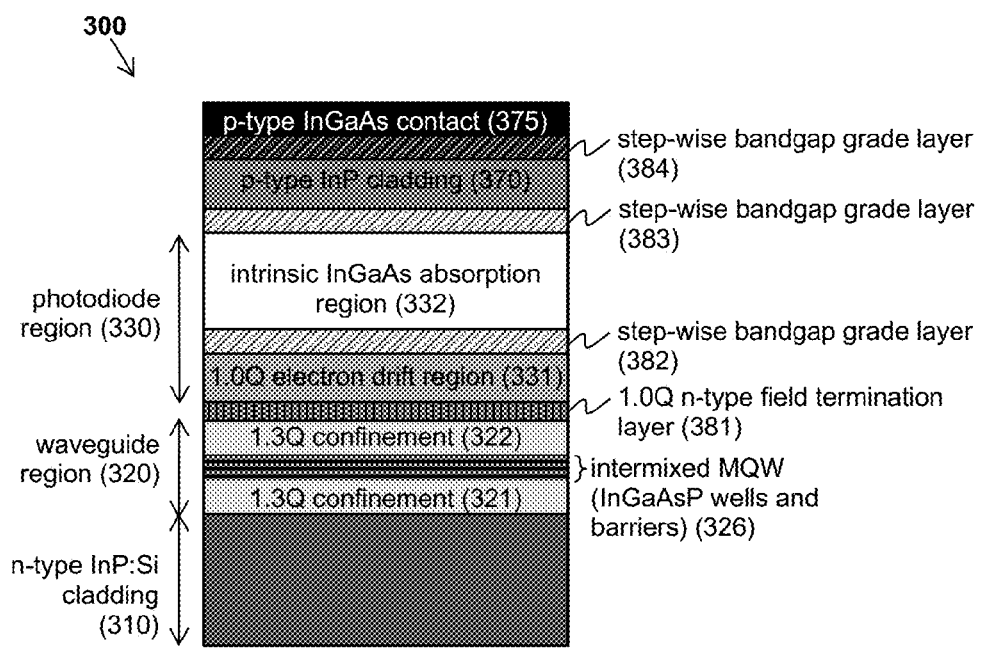
FIG. 3 is a schematic of an exemplary integrated structure 300.

Each layer or region in the structure can include any useful material (e.g., any described herein). In one particular embodiment (FIG. 3), the integrated structure 300 includes a p-type InGaAs contact layer 375; a step-wise bandgap grade layer 384; a p-type InP cladding layer 370; a step-wise bandgap grade layer 383; a photodiode region 330 including an intrinsic InGaAs absorption region 332, a step-wise bandgap grade layer 382, and a 1.0Q electron drift region 331; a 1.0Q n-type field termination layer 381; a waveguide region 320 including an InGaAsP intermixed MQW region 326 disposed between two 1.3Q confinement layers 321, 322; and an n-type InP:Si cladding layer 310. Additional materials are described herein.

Materials

The components of the integrated structure can include any useful material. Exemplary materials include III-V materials, such as InP, InGaAs, InGaAsP, InAlGaAs, InGaN, GaN, GaAs, and AlGaAs, including intrinsic forms and those with n-type dopants (e.g., silicon, sulfur, selenium, tellurium, or germanium for III-V materials) or p-type dopants (e.g., zinc, magnesium, cadmium, silicon, or germanium for III-V materials).

Any useful combinations of materials can be used to form the quantum well and barriers. Exemplary combinations of quantum well/barrier materials include compressively strained InGaAsP/tensile strained InGaAsP (e.g., compressively strained $In_{0.735}Ga_{0.265}As_{0.845}P_{0.115}$ wells and tensile strained $In_{0.735}Ga_{0.265}As_{0.513}P_{0.487}$ barriers), InGaAsP/InP (e.g., $In_{0.95}Ga_{0.05}As_{0.10}P_{0.90}$ wells and InP barriers), InGaAs/InP (e.g., $In_{0.32}Ga_{0.68}As$ wells and InP barriers), InGaAs/InGaAsP (e.g., $In_{0.53}Ga_{0.47}As$ wells and $In_{0.83}Ga_{0.17}As_{0.37}P_{0.63}$ barriers; or $In_{0.32}Ga_{0.68}As$ wells and $In_{0.79}Ga_{0.21}As_{0.42}P_{0.58}$ barriers), InGaAs/InAlGaAs (e.g., $In_{0.53}Ga_{0.47}As$ wells and $In_{0.53}Al_{0.20}Ga_{0.27}As$ barriers), GaAs/AlGaAs (e.g., GaAs wells and $Al_xGa_{1-x}As$ barriers, where x is 0.26, 0.3, or 0.4), and InGaN/GaN. The wells and barriers can have any useful height (e.g., of about 5 to 15 nm and any useful bandgap wavelength $\lambda_g$ (e.g., of from about 0.8 to 2 μm).

The confinement region can include any useful cladding material, such as InGaAsP:Si (1.3Q:Si), InGaAsP:Zn, InP, InGaAsP, a 1.3Q material, or a 1.4Q material, including intrinsic or doped forms thereof (e.g., n- or p-doped forms).

The photodiode region can include various components, such as a capping layer (e.g., including InGaAs, such as p-doped forms thereof), a diffusion barrier (e.g., including InGaAsP, such as p-doped forms thereof), a p-layer (e.g., including InP), an absorption region (e.g., including InGaAs, InGaAs:Zn, or InAlAs, including intrinsic or doped forms thereof), a spacer region (e.g., including InGaAs, InGaAsP, or InP, including intrinsic or doped forms), a cliff region (e.g., including InP, such as n-doped forms thereof), an electron drift region (e.g., including a 1.0Q material, InP, InAlAs, InGaAsP, or InGaAs, including intrinsic or doped (e.g., n-doped) forms thereof), a sub-collector region, and/or an n-layer (e.g., including InP).

Any useful material or component may be disposed between the photodiode and waveguide region, e.g., a field termination layer (e.g., including optionally doped 1.0Q or 1.3Q:Si materials, such as those including InGaAsP or InGaAlAs).

In addition, a cladding layer may be present between the waveguide region and the re-contact layer and/or between the photodiode region and the p-contact layer. The cladding layer can be formed of any useful cladding material, e.g., InP (e.g., n- or p-doped forms thereof).

One or more contact layers can include n-type material (e.g., InP:Si) or p-type material (e.g., InGaAs). In addition, one or more p- or n-contact pads can be formed, e.g., from a metal, such as Cu, Ag, Al, W, Ti, Pt, Au, Ge, Ni, or combinations thereof, that is electrically connected to a p-type or n-type material or layer, respectively. Finally, one or more passivation layers may be present to electrically and/or optically isolate various components, where material for such layers includes an insulator (e.g., $SiO_2$, SiN, or SiON) or a dielectric (e.g., a polymeric dielectric, such as bis-benzocyclobutene).

Between any heterointerface, one or more grade layers can be present. Such grade layers can include any useful material (e.g., an impedance matching material), including InGaAsP, InGaAs, InP:Si, InGaAs:Zn, or InP, as well as doped forms (e.g., n-doped or p-doped forms) thereof. Such grade layers can include the same material, but each layer can include a different amount of doping, thereby providing step-wise graded layers. A skilled artisan would understand how to configure such grade layers to ensure a smooth change in conduction bands between heterojunctions or heterointerfaces.

During the fabrication process, one or more temporary structures can be present to aid in the fabrication of the integrated structure. Exemplary temporary structures include an implant layer configured to capture implanted ion (e.g., including InP, GaAs, SiO$_2$, Si, Si$_3$N$_4$, or SrF$_2$, based on the type of QWI process, such as one that employs ions, plasma (e.g., Ar plasma), lasers (e.g., ArF or KrF lasers), etc.) and one or more stop-etch layers to selectively etch particular layers within a stack (e.g., including 1.3Q:Si, InP, InGaAsP, and/or InGaAs), etc.

Uses

The structures and methods of the invention can be employed for any useful purpose. Exemplary uses include any optoelectronic component or circuits including such components, such as semiconductor lasers, modulators, detectors, resonators, photodiodes, photonic integrated circuits, optical-to-analog converters, optical gates, etc., including any described in U.S. Pat. No. 7,564,387, which is incorporated herein by reference in its entirety.

EXAMPLE

Example 1

Integrated Guided-Wave Photodiode Using Through-Absorber Quantum-Well-Intermixing Monolithic integration of optoelectronic components have been pursued for many applications due to the potential to not only reduce size, weight, and power of such systems, but also to enable new functionality which cannot be emulated by discrete components. Quantum-well-intermixing (QWI) has been shown to be a powerful technique to enable the integration of many optoelectronic components including semiconductor lasers, amplifiers, attenuators, photodiodes, electro-absorption modulators, active ring-resonators, and various low-loss waveguide components (see, e.g., Skogen E J et al., "Optical AND and NOT gates at 40 Gbps using electro-absorption modulator/photodiode pairs," *Proc. 23$^{rd}$ Annual Meeting of the IEEE Photonics Soc.*, held on 7-11 Nov. 2010 in Denver, Colo., pp. 52-3; and Tauke-Pedretti A et al., "Mutual injection locking of monolithically integrated coupled-cavity DBR lasers," *IEEE Photonics Technol. Lett.* 2011 July; 23(13):908-10).

Quantum-well-intermixing selectively modifies the spatial profile of the quantum well usually resulting in an increase in the quantized energy state characterized by a blue-shift of the quantum well bandedge. This process allows the circuit designer to tailor the bandedge across the wafer enabling optoelectronic components with differing functionalities to reside side-by-side. For instance, a tunable laser can be fabricated by blue-shifting the as-grown multiple-quantum-well (MQW) gain region, such that DBR mirrors will have low optical absorption loss yet retain highly efficient carrier induced tuning (see, e.g., Skogen E J et al., "Monolithically integrated active components: A quantum-well intermixing approach," *IEEE J. Sel. Topics Quantum Electron.* 2005 March/April; 11(2):343-55). Further, an electroabsorption modulator can also be integrated with such a laser by creating an intermediate bandedge, which can be shifted into and out of the laser operating wavelength efficiently based on the quantum-confined Stark effect (QCSE) (see, e.g., Skogen E J et al., *IEEE J. Sel. Topics Quantum Electron.* 2005 March/April; 11(2):343-55).

One key component in photonic integrated circuits (PICs) is the photodiode. Although simple photodiodes can be fabricated using the same MQW region for a laser or amplifier, they tend to suffer from carrier-induced field screening resulting in the loss of quantum efficiency at low biases (see, e.g., Raring J W et al., "Design and demonstration of novel QW intermixing scheme for the integration of UTC-type photodiodes with QW-based components," *IEEE J. Quantum Electron.* 2006 February; 42(2):171-81). High performance guided-wave photodetectors commonly employ an offset absorber region, usually placed above the waveguide core, such as in the uni-traveling carrier (UTC) photodiode (Raring J W et al., *IEEE J. Quantum Electron.* 2006 February; 42(2):171-81). However, the fabrication of such detectors is difficult, adding an additional epitaxial regrowth step to place the detector epitaxial layers above the main waveguide core. Clearly a relatively simple, efficient, high-speed, high-input saturation power, guided-wave photodiode compatible with monolithic integration has been somewhat elusive. Reported designs either suffer from front-end saturation effects or require additional epitaxial regrowth steps (Raring J W et al., *IEEE J. Quantum Electron.* 2006 February; 42(2):171-81).

Here, we present a new photodiode design that not only enables the desired characteristics, but eliminates the need for a photodiode-specific epitaxial regrowth step. In our process, the photodiode structure is included in the first epitaxial growth along with the required main waveguide core below. We were able to blue-shift the bandedge of the QWs residing within the waveguide core by diffusing point defects through the detector/photodiode structure, thereby maintaining the ability to tailor the bandedge of the MQW with the detector layers already in place. This simplifies the process by eliminating the photodiode specific regrowth step.

Design:

The photodiode was designed to be monolithically integrated with a variety of devices which utilize a quantum well-based active region; however, this is not required. Devices such as MQW laser gain regions, amplifiers, QCSE-based modulators, etc., can be integrated on the same chip with the photodiode. In addition, all of the previous devices which utilize a QWI processing approach are compatible with this new photodiode design, that is, there is no loss of capability due to the addition of the photodiode.

The photodiode includes two main parts, a bulk optical absorption region epitaxially grown above an electron drift region, both of which are unintentionally doped (UID). This design places the absorber offset toward the p-type cladding layer, which aids in the expedient extraction of holes, thereby mitigating the collapse of the electric field through field screening, and enabling a high input saturation power.

Figure 4:
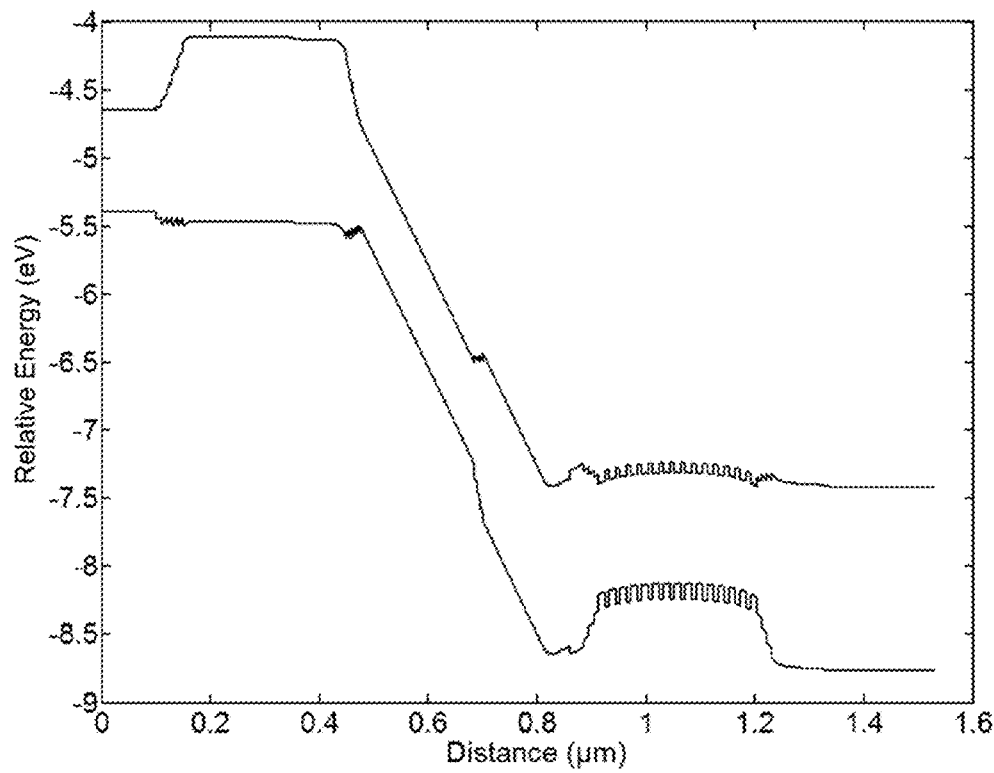
FIG. 4 is a band diagram of the structure fabricated biased at −2.0 V. From the left, the layer structure includes the following: p-type contact layer, step-wise grade, p-type cladding, step-wise grade, photodiode absorption region, step-wise grade, electron drift region, field termination layer, phase modulator MQW, and n-type cladding.

The band diagram of the completed structure is shown in FIG. 4. In the figure, from the left, the device consists of a 100 nm p-type InGaAs contact layer, a step-wise bandgap grade, a p-type InP cladding layer (not shown full thickness) followed by a step-wise bandgap grade, a 210 nm intrinsic InGaAs bulk optical absorber, another step-wise grade, a 110 nm 1.0Q electron drift region, and finally a 1.0Q n-type field termination layer. Below the photodiode structure resides a MQW-based waveguide core and n-type cladding. The waveguide structure under the photodiode can take the form of any reasonable guided-wave architecture. In this particular case, the MQW region is designed as a phase modulator, but it could equally be designed as a laser gain region, for example.

The photodiode structure was designed to reside in a plane above the main optical waveguide layer, where the optical signals couple to the photodiode region through vertical multimode interference beating. The photodiode was designed such that the absorption of the optical signal would occur over the first half of the beat cycle upon entering the photodiode region, which is essential in order to keep the photodiode physically small. Beam propagation method (BPM) simulations were conducted to optimize the beat length such that the optical absorption in the first half cycle was maximized.

Figure 5:
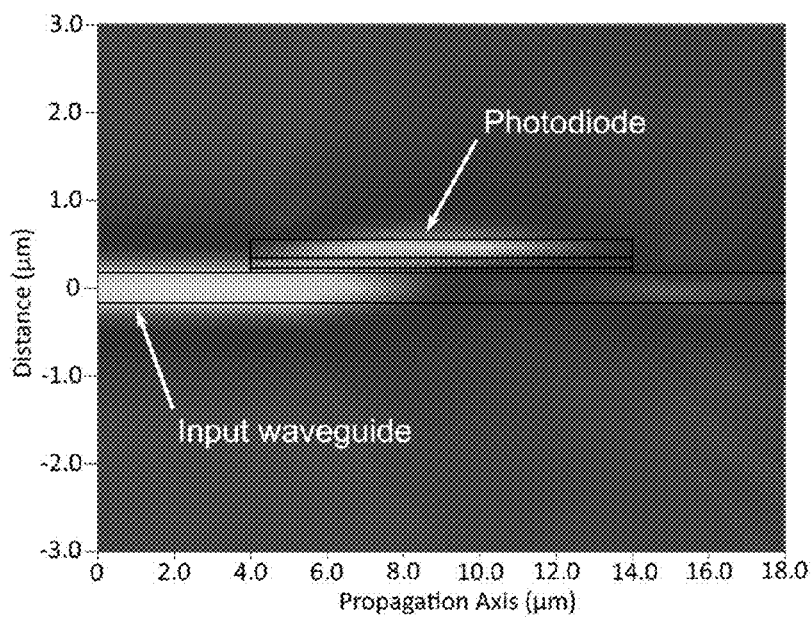
FIG. 5 is a side-view cross-section beam propagation simulation of the multimode interference beat coupling to the above photodiode absorption region (top-most outlined region). The layers below the absorption layer are the electron drift region and the field termination layer. The figure shows a short waveguide section before beating up into the photodiode absorption region. A small percentage of optical power beats back into the main waveguide after the photodiode.

A representative BPM simulation is shown in FIG. 5. As shown in the figure, the optical signal enters from the left guided by the underlying waveguide core. Upon entering the photodiode region the optical signal beats into the photodiode absorbing layer. Beyond the photodiode, the remaining optical signal beats back into the main waveguide core. This design also aids in the elimination of front-end saturation due to the fact that the optical signal beats into the absorber layer from the underlying waveguide core, and as is evident from the figure, the leading edge of the photodiode witnesses very little optical power. Rather, the optical power is distributed more uniformly along the length of the device than an end-fired waveguide photodiode.

Fabrication:

The device fabrication began as an epitaxial base-structure grown using a commercial MOCVD reactor. The base-structure is similar to that shown in FIG. 3, with the exception that the p-type InP cladding is absent and the photodiode structure is capped with a 20 nm UID stop-etch layer and a 450 nm UID InP implant buffer region.

The QWI process is similar to that described in Skogen E J et al., *IEEE J. Sel. Topics Quantum Electron.* 2005 March/April; 11(2):343-55, where the implant buffer layer is designed to capture completely the ion-implant. During a rapid thermal anneal (RTA) process, only mobile point defects are able to diffuse through the structure, where defect complexes remain in the implant buffer region. The implant buffer region can then be selectively removed in order to keep the device free of such defects. Unique to this process is the fact that the point defects are allowed to propagate through the photodiode layers to reach the underlying MQW. We found that the quantum well intermixing process was virtually unaffected by the additional photodiode layers and blue-shifted the MQW, as expected.

After the QWI process, the implant buffer layer was removed. The regions where photodiodes are not desired were patterned and those layers removed, leaving the main waveguide core intact and selectively intermixed. A single MOCVD-based regrowth process was used to blanket the wafer with both a p-type InP cladding and InGaAs contact layers.

Results:

Deep etch waveguides were fabricated in both as-grown and intermixed material. Optical losses were extracted using Fabry-Perot resonators over a range of wavelengths from 1535 nm to 1580 nm. As-grown regions showed optical losses from 3.5 $cm^{-1}$ to 5.7 $cm^{-1}$ for wavelengths from 1580 nm to 1535 nm, respectively. The intermixed material demonstrated reduced optical losses of 3 $cm^{-1}$ for all wavelengths tested.

Photodiodes of widths from 6 μm to 10 μm with length of 10 μm were characterized using a nominal wavelength of 1550 nm. Using a photodiode series test structure, the quantum efficiency of the devices was extracted to be between 90% and 94% for the various sizes for optical input powers between 5 mW and 30 mW.

Figure 6:
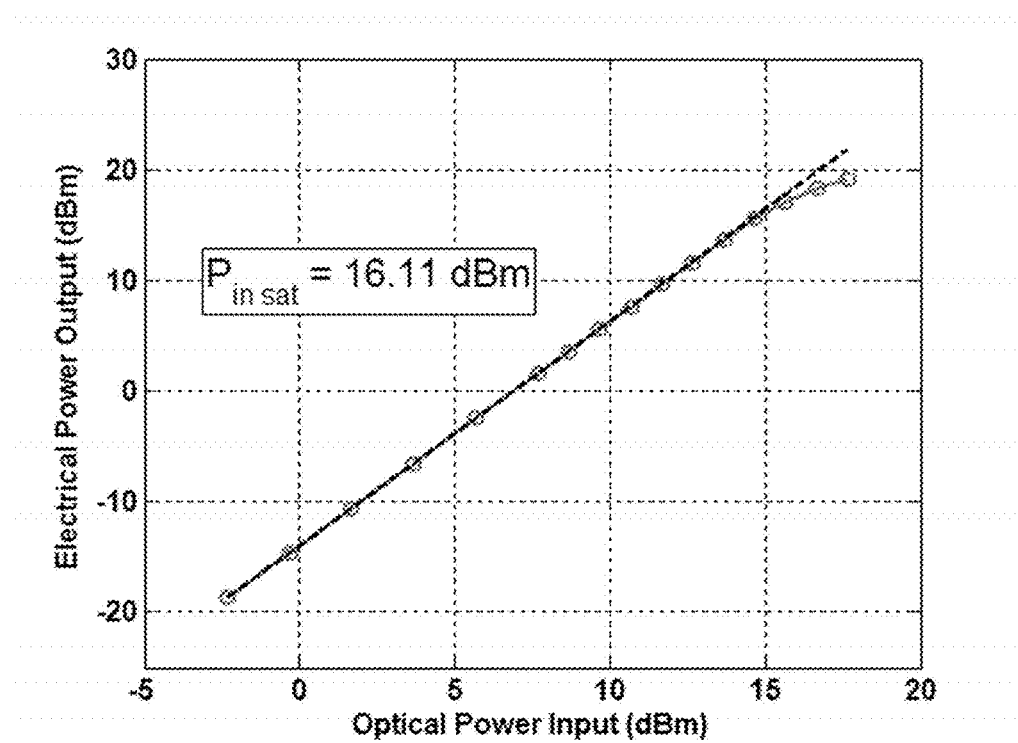
FIG. 6 is a graph showing DC electrical output power into 50Ω as a function of CW optical input power at 1550 nm. The 1-dB compression point occurs at 16.1 dBm for a 3 V reverse bias.

The optical input saturation power was measured at the 1-dB compression point and found to be 13.7 dBm for the 6 μm×10 μm (6×10) photodiode and 16.1 dBm for the 10 μm×10 μm (10×10) photodiode for a reverse bias of 3 V. At a reverse bias of as little as 1 V the 1-dB compression point was found to be 10.7 dBm and 12.7 dBm for the 6×10 and 10×10 devices, respectively. A representative plot showing the optical to electrical power conversion is shown in FIG. 6.

The small-signal frequency response of the photodiodes was characterized using a vector network analyzer. Port 1 of the network analyzer drove a commercial modulator to modulate a 1550 nm CW laser which was detected by a calibrated commercial photodiode. This system was normalized, and the commercial photodiode replaced with the photodiode under test. The photodiodes were measured, and the response of the reference detector was removed.

Figure 7:
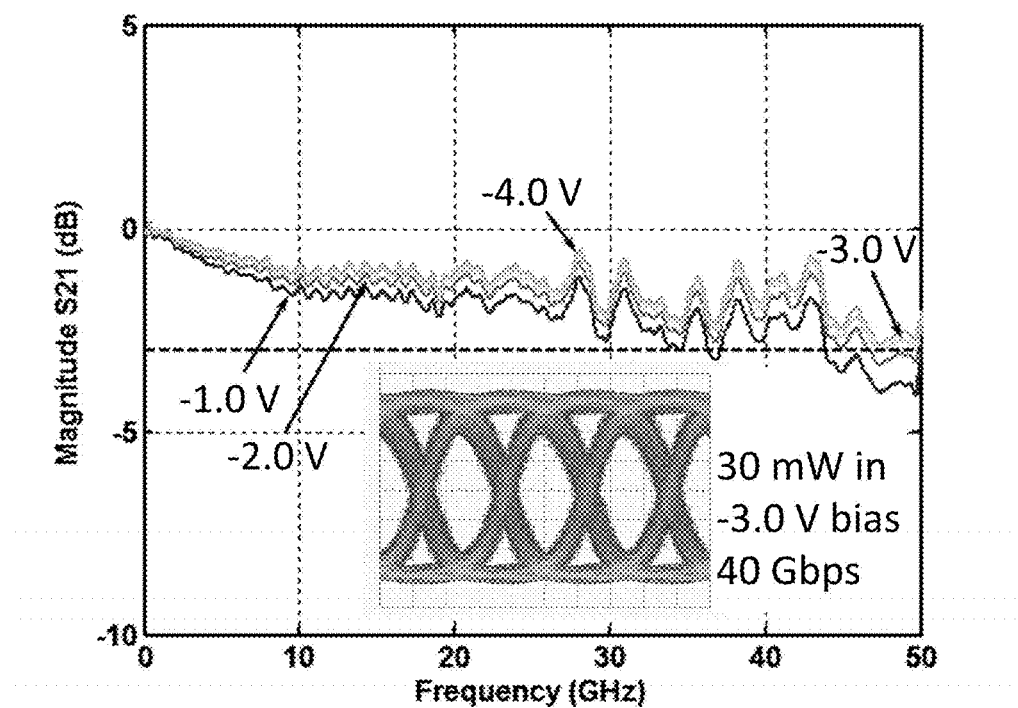
FIG. 7 shows the normalized small-signal frequency response for a 10 μm×10 μm photodiode for various reverse biases at 1550 nm. Inset shows an eye-diagram for 30 mW optical power input, −3.0 bias at 40 Gbps.

FIG. 7 shows a representative normalized frequency response of the 10×10 device. For a reverse bias of 1 V the 3-dB bandwidth was roughly 35 GHz, while for a 4 V reverse bias the bandwidth extended beyond 50 GHz. Eye diagrams were also generated using a large-signal PRBS data stream and found be open at 3 V reverse bias with optical input power of 30 mW for the 10×10 device (shown in FIG. 7 inset). Open eyes were also observed at reverse bias of 4.5 V with optical input power of 40 mW.

In conclusion, a new photodiode design capable of being monolithically integrated with other optoelectronic components has been demonstrated. This is the first demonstration of a new QWI process to blue-shift the bandedge of an underlying MQW layer by intermixing through the photodiode layers. Despite having point defects propagate through the photodiode structure, the photodiode demonstrated outstanding performance characteristics that rival the state of the art discrete devices (Li N et al., "High-saturation-current charge-compensated InGaAs—InP uni-traveling-carrier photodiode," *IEEE Photonics Technol. Lett.* 2004 March; 16(3):864-6). Specifically, the 10×10 photodiode demonstrated over 16 dBm input saturation power at the 1-dB compression point, and over 50 GHz small-signal 3-dB bandwidth with a reverse bias of 4 V all with a quantum efficiency of over 90%.

Other Embodiments

All publications, patents, and patent applications mentioned in this specification, including U.S. Provisional Application No. 62/025,656, filed Jul. 17, 2014, are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method of fabricating an integrated structure, the method comprising:
   providing a base structure comprising a multiple-quantum-well (MQW) region and a photodiode region;
   patterning a top surface of the base structure with a mask to define an active region and a passive region;

introducing impurities, creating vacancies, or heating through the photodiode region and into the MQW region, thereby producing an intermixed MQW region; and depositing one or more cladding layers on the photodiode region.

2. The method of claim 1, wherein the base structure comprises the MQW region underlying the photodiode region.

3. The method of claim 2, wherein the base structure further comprises an implant layer disposed above the photodiode region.

4. The method of claim 3, wherein the MQW region is disposed between two confinement layers.

5. The method of claim 1, wherein the photodiode region comprises an absorption region, an electron drift region, and/or a sub-collector region.

6. The method of claim 5, wherein the base structure further comprises a waveguide region disposed beneath the photodiode region, wherein the waveguide region comprises the MQW region.

7. The method of claim 6, wherein the base structure further comprises a field termination layer disposed between the photodiode region and the waveguide region.

8. The method of claim 7, wherein the base structure further comprises an n-type cladding layer and/or an n-type contact layer disposed beneath the MQW region.

9. The method of claim 8, wherein the base structure further comprises one or more bandgap grade layers between two layers having a different bandgap separation.

10. The method of claim 1, further comprising removing the mask.

11. The method of claim 1, wherein the introducing impurities, creating vacancies, or heating through the photodiode region and into the MQW region comprises implanting an ion into the base structure, thereby creating an implanted structure, and annealing the implanted structure, thereby diffusing one or more vacancies through the photodiode region and into the MQW region and producing the intermixed MQW region.

12. The method of claim 1, further comprising patterning a top surface of the base structure with a photodiode mask to define a photodiode, wherein the photodiode comprises a portion of the photodiode region.

13. The method of claim 12, further comprising removing a portion of the base structure, thereby releasing the photodiode from the base structure.

14. The method of claim 1, further comprising, after step iii), depositing one or more contact layers on the one or more cladding layers.

15. A method of fabricating an integrated structure, the method comprising:
    providing a base structure comprising a multiple-quantum-well (MQW) region and a photodiode region;
    patterning a top surface of the base structure with a hard mask to define an active region and a passive region;
    introducing impurities, creating vacancies, or heating through the photodiode region and into the MQW region, thereby producing an intermixed MQW region within the active region;
    removing the hard mask, thereby exposing a top surface of the base structure having the intermixed MQW region;
    patterning a top surface of the base structure with a photodiode mask to define a photodiode, wherein the photodiode comprises a portion of the photodiode region; and
    removing a portion of the base structure, thereby releasing the photodiode from the base structure.

16. The method of claim 15, further comprising depositing one or more cladding layers on the photodiode region, thereby providing a cladded base structure.

17. The method of claim 16, further comprising depositing and/or patterning one or more contact layers on a top surface or a bottom surface of the cladded base structure.

18. The method of claim 15, wherein the introducing impurities, creating vacancies, or heating through the photodiode region and into the MQW region comprises implanting an ion into the base structure, thereby creating an implanted structure, and annealing the implanted structure, thereby diffusing one or more vacancies through the photodiode region and into the MQW region and producing the intermixed MQW region.

19. A method of fabricating an integrated structure, the method comprising:
    providing a base structure comprising a multiple-quantum-well (MQW) region and a photodiode region;
    patterning a top surface of the base structure with a hard mask to define an active region and a passive region;
    introducing impurities, creating vacancies, or heating through the photodiode region and into the MQW region;
    removing the hard mask, thereby exposing a top surface of the base structure having the intermixed MQW region;
    patterning a top surface of the base structure with a photodiode mask to define a photodiode, wherein the photodiode comprises a portion of the photodiode region;
    removing a portion of the base structure; and
    depositing one or more cladding layers on the photodiode region, thereby providing a cladded base structure.

20. The method of claim 19, further comprising depositing one or more contact layers on a top surface or a bottom surface of the cladded base structure.

21. The method of claim 19, wherein the introducing impurities, creating vacancies, or heating through the photodiode region and into the MQW region comprises implanting an ion into the base structure, thereby creating an implanted structure, and annealing the implanted structure, thereby diffusing one or more vacancies through the photodiode region and into the MQW region and producing the intermixed MQW region.

22. The method of claim 19, wherein the MQW region is between two confinement layers.

* * * * *